United States Patent
Dasgupta et al.

(10) Patent No.: US 9,748,235 B2
(45) Date of Patent: Aug. 29, 2017

(54) GATE STACK FOR INTEGRATED CIRCUIT STRUCTURE AND METHOD OF FORMING SAME

(71) Applicant: GLOBALFOUNDRIES INC., Grand Cayman (KY)

(72) Inventors: Aritra Dasgupta, Clifton Park, NY (US); Benjamin G. Moser, Malta, NY (US); Mohammad Hasanuzzaman, Beacon, NY (US); Murshed M. Chowdhury, Fremont, CA (US); Shahrukh A. Khan, Danbury, CT (US); Shafaat Ahmed, Ballston Lake, NY (US); Joyeeta Nag, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/013,169

(22) Filed: Feb. 2, 2016

(65) Prior Publication Data
US 2017/0221889 A1  Aug. 3, 2017

(51) Int. Cl.
*H01L 27/088* (2006.01)
*H01L 29/49* (2006.01)
*H01L 29/51* (2006.01)
*H01L 21/8234* (2006.01)

(52) U.S. Cl.
CPC .... *H01L 27/0886* (2013.01); *H01L 21/82345* (2013.01); *H01L 21/823431* (2013.01); *H01L 29/4958* (2013.01); *H01L 29/4966* (2013.01); *H01L 29/511* (2013.01); *H01L 29/518* (2013.01)

(58) Field of Classification Search
CPC ......... H01L 29/66795; H01L 29/66545; H01L 21/823431; H01L 29/0847; H01L 29/161
See application file for complete search history.

(56) References Cited

U.S. PATENT DOCUMENTS

| | | | |
|---|---|---|---|
| 8,420,476 B2* | 4/2013 | Booth, Jr. | ....... H01L 21/823821 257/289 |
| 2013/0241003 A1* | 9/2013 | Lin | ................. H01L 21/823431 257/392 |
| 2015/0270177 A1* | 9/2015 | Tseng | ............. H01L 21/823857 438/216 |
| 2015/0270373 A1* | 9/2015 | Horak | ............... H01L 29/66545 257/401 |

(Continued)

*Primary Examiner* — Marcos D Pizarro
*Assistant Examiner* — Shannon Yi
(74) *Attorney, Agent, or Firm* — Yuanmin Cai; Hoffman Warnick LLC

(57) ABSTRACT

One aspect of the disclosure relates to a method of forming an integrated circuit structure. The method may include: forming a first work function metal over a set of fins having at least a first fin and a second fin; implanting the first work function metal with a first species; removing the implanted first work function metal from over the first fin such that a remaining portion of the implanted first work function metal remains over the second fin; forming a second work function metal over the set of fins including over the remaining portion of the implanted first work function metal; implanting the second work function metal with a second species; and forming a metal over the implanted second work function metal over the set of fins thereby forming the gate stack.

20 Claims, 8 Drawing Sheets

(56) References Cited

U.S. PATENT DOCUMENTS

2016/0020118 A1* 1/2016 Park ................ H01L 21/28088
438/592
2016/0163799 A1* 6/2016 Kim ................ H01L 21/823821
257/203

* cited by examiner

GATE STACK FOR INTEGRATED CIRCUIT STRUCTURE AND METHOD OF FORMING SAME

BACKGROUND

Technical Field

The present disclosure relates to integrated circuits, and more particularly, to gate stacks for integrated circuit structures which have been implanted with a species, and a method of forming the same.

Related Art

In the integrated circuit industry, continued miniaturization of transistor structures requires changes in processes to achieve desired performance characteristics of the integrated circuit. One such consideration in the overall performance of a transistor is gate induced drain leakage (GIDL). GIDL refers to unwanted leakage of current between the gate and drain terminals of a transistor. GIDL may occur due to a high field-effect in the drain junction of the transistor. GIDL results in a loss of control of the terminals within the transistor devices. Factors that affect GIDL include gate oxide thickness, the drain dopant concentration, the lateral doping gradient, and the applied drain-to-gate voltage. Various processes have been proposed to reduce GIDL in transistors. For example, sources and drains and/or their respective extension regions have been implanted with particular dopants which have the effect of reducing GIDL. However, such processes are complex, costly, and time consuming.

SUMMARY

A first aspect of the disclosure relates to a method of forming a gate stack for an integrated circuit structure. The method may include: forming a first work function metal over a set of fins having at least a first fin and a second fin; implanting the first work function metal with a first species; removing the implanted first work function metal from over the first fin such that a remaining portion of the implanted first work function metal remains over the second fin; forming a second work function metal over the set of fins including over the remaining portion of the implanted first work function metal; implanting the second work function metal with a second species; and forming a metal over the implanted second work function metal over the set of fins thereby forming the gate stack.

A second aspect of the disclosure relates to a gate stack for an integrated circuit structure, the integrated circuit structure having a first opening and a second opening in a dielectric layer over a set of fins. The gate stack may include: a first work function metal over the first fin, the first work function metal being implanted with a first species; a second work function metal over the first fin and the second fin, the second work function metal being over the first work function metal over the first fin and implanted with a second species; and a metal over the second work function metal.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the invention. In the drawings, like numbering represents like elements between the drawings.

DETAILED DESCRIPTION

The present disclosure relates to integrated circuits (IC) structures, and more particularly, to gate stacks for IC structures which have been implanted with an implanted species, and a method of forming the same. Specifically, the present disclosure provides for implanting the work function metals of gate stacks with dopants to reduce gate induced drain leakage (GIDL).

Aspects of the present disclosure are shown and described with respect to a fin-shaped field-effect transistor (FINFET). However, it is to be understood that aspects of the present disclosure are equally applicable to other types of transistors, such as but not limited to field-effect transistors, including transistors with different geometrical orientations and shapes of their channels such as planar FETs, surround-gate FETs, multiple-gate FETs, nano-wire or nano-sheet FETs, and vertical FETs. Further, aspects of the present disclosure are shown and described with respect to replacement metal gate stacks. However, it is to be understood that the present disclosure is equally applicable to a gate-first process.

Figure 1:
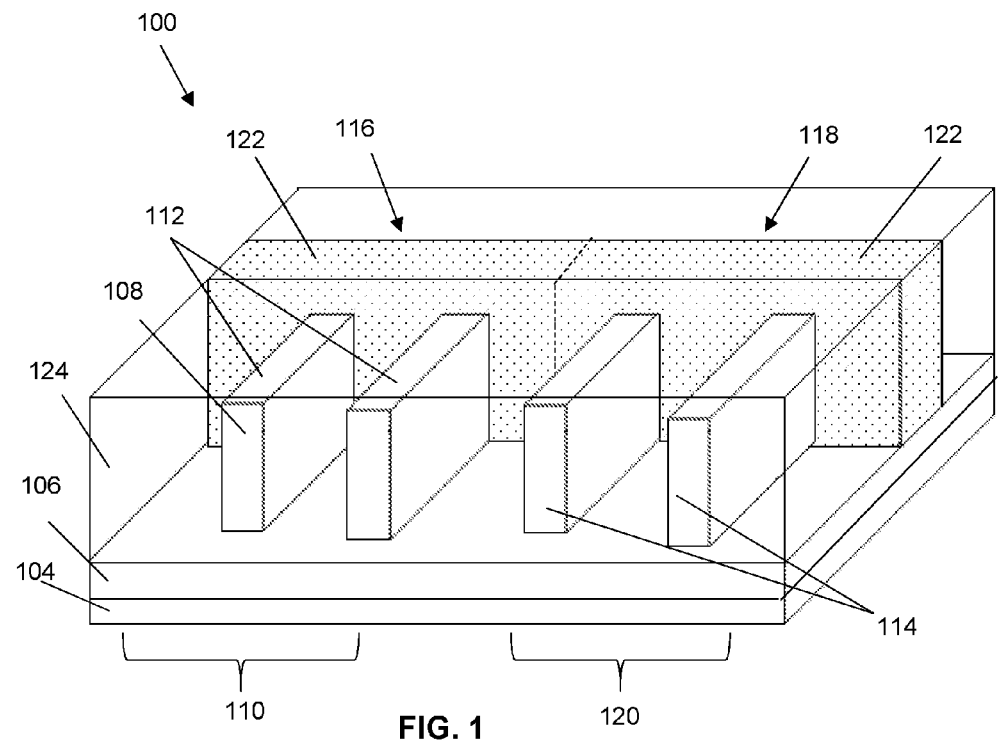
FIG. 1 shows a three-dimensional view of an integrated circuit having a dummy gate.

FIG. 1 shows an IC structure as a FINFET 100 that has undergone preliminary steps leading up to the methods according to embodiment of the invention. FINFET 100 may include a n-type field-effect transistor (NFET) region 110 and a p-type field effect transistor (PFET) region 120. NFET region 110 and PFET region 120 may be laterally adjacent to one another on a semiconductor layer 104. It will be understood that when an element as a layer, region or substrate is referred as being "over" another element, it can be directly on the other element or intervening elements may be present. It will also be understood that when an element is referred to as being "connected" or "coupled" to another element, it can be directly connected or couple to the other element or intervening elements may be present. Overlying semiconductor layer 104 may be a buried oxide (BOX) layer 106, and overlying BOX layer 106 may be a silicon-on-insulator (SOI) layer 108.

Semiconductor layer 104 and SOI layer 108 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Fins 112, 114 may be formed in both PFET region 110 and NFET region 120 from SOI layer 108 as known in the art, e.g., via conventional etching and masking techniques. Fins 112, 114 may include doped regions (not shown) that may constitute the other parts of a transistor, e.g., sources and drains.

As used herein "etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

After fins 112, 114 are formed, gates 116, 118, i.e. dummy gates, may be formed as known in the art. Additionally, an interlayer dielectric (ILD) layer 124 may be deposited over gates 116, 118. "Depositing," as used herein, may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. ILD layer 124 may include a flowable chemical vapor deposited (FCVD) oxide, e.g., silicon oxide ($SiO_2$). However, ILD layer 124 may include other materials such as but not limited to: silicon nitride ($Si_3N_4$), fluorinated $SiO_2$ (FSG), hydrogenated silicon oxycarbide (SiCOH), porous SiCOH, borophospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Figure 2:
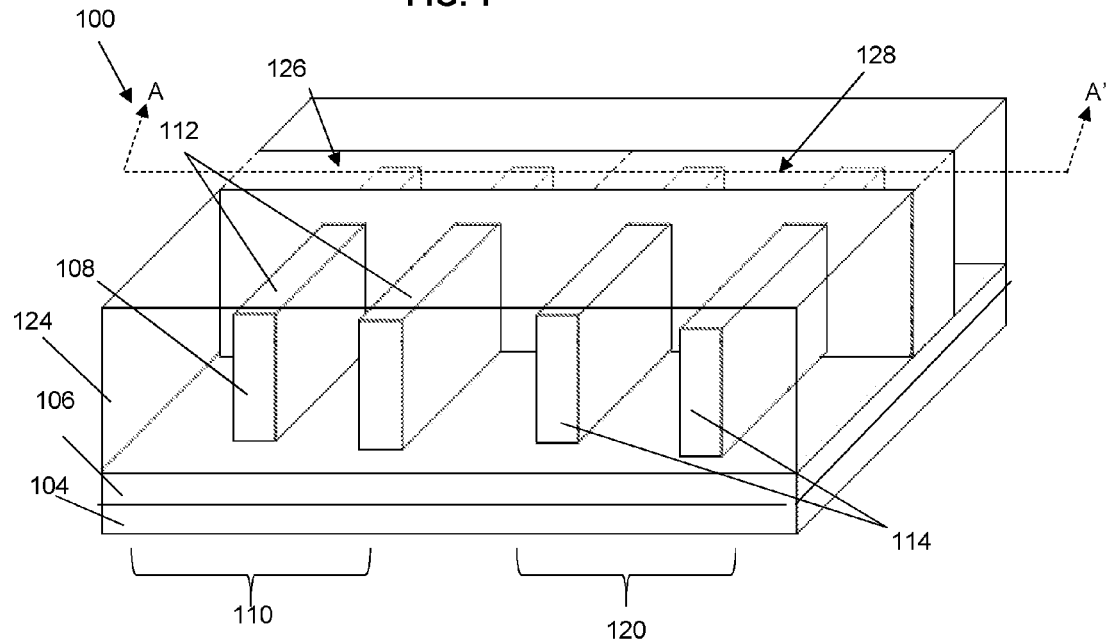
FIG. 2 shows a three-dimensional view of an integrated circuit wherein the dummy gate is removed.
Figure 3:
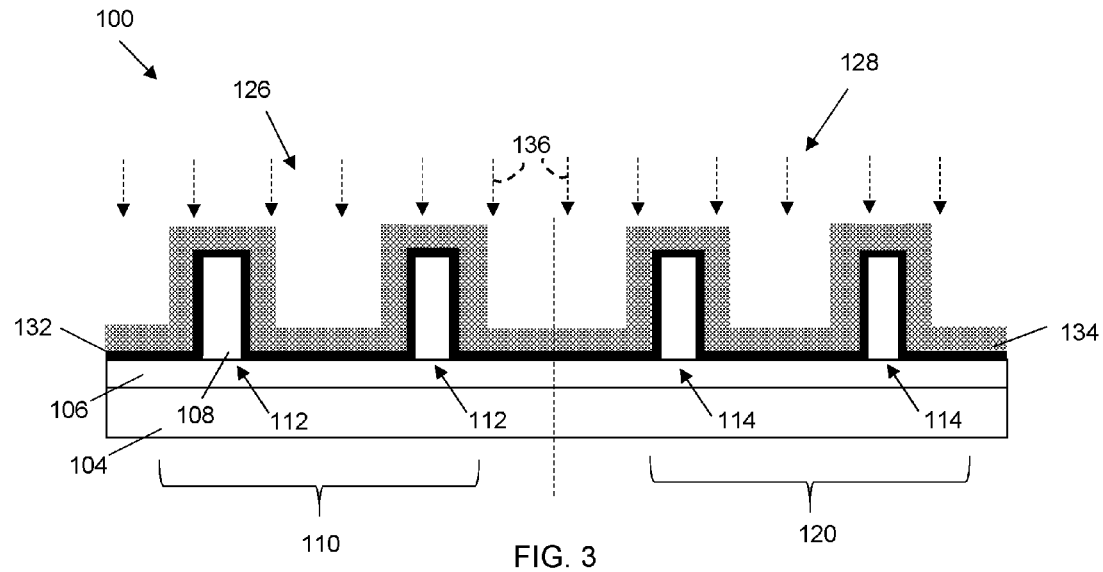
FIGS. 3-8 show cross-sectional views of the integrated circuit structure of FIG. 2 taken along line A-A' undergoing aspects of a method according to embodiments of the disclosure.

Gates 116, 118 in the form of dummy gates can allow other processing steps, e.g., adjacent contact creation, to be carried out without damaging an eventual metal gate that will replace the dummy gate. Referring to FIGS. 1-2 together, gates 116, 118 may be removed to create openings 126, 128 in ILD layer 124 in which replacement gate stacks may be formed as described herein. That is, sacrificial material 122 of gates 116, 118 may be removed, e.g., by an etch selective to sacrificial material 122, leaving openings 126, 128 such as by application of a wet etching material selective to metals. Opening 126 may be positioned over PFET region 110, and opening 128 may be positioned over NFET region 120. While the disclosure refers to replacement gate stacks, it is to be understood that the methods and gate stacks described herein are equally applicable to a gate-first embodiment.

FIGS. 3-8 show cross-sectional views of FINFET 100 along line A-A' of FIG. 2 undergoing aspects of a method as described herein. A layer having a high dielectric constant (high-k layer) 132 may be formed, e.g., deposited or grown, over fins 112, 114. High-k layer 132 may include but is not limited to: hafnium oxide ($HfO_2$), or high dielectric constant (>3.9) materials. High-k layer 132 may be formed such that it substantially surrounds fins 112, 114 and covers a horizontal field between each fin 112, 114. High-k layer 132 may have a thickness of approximately 10 Angstroms to approximately 20 Angstroms. More particularly, high-k layer 132 may have thickness of approximately 16 Angstroms. As used herein "approximately" is intended to include values, for example, within 10% of the stated values. Still referring to FIG. 3, a work function metal 134 may be formed, e.g., deposited or grown, over high-k layer 132 within each opening 126, 128 over fins 112, 114. Work function metal 134 may include a PFET work function metal optimized for PFET performance such as but not limited to a metallic nitride layer, e.g., titanium nitride (TiN) or tantalum nitride (TaN). Work function metal 134 may be implanted, e.g., via ion implantation, with a species 136, e.g., a dopant. In one embodiment, species 136 may include at least one of: fluorine (F) and aluminum (Al). Work function metal 134 may have a thickness of approximately 10 Angstroms to approximately 65 Angstroms. During the implanting as described herein, the implanted species may diffuse into the layer beneath the work function metal that is being implanted depending on the conditions of the implant.

Figure 4:
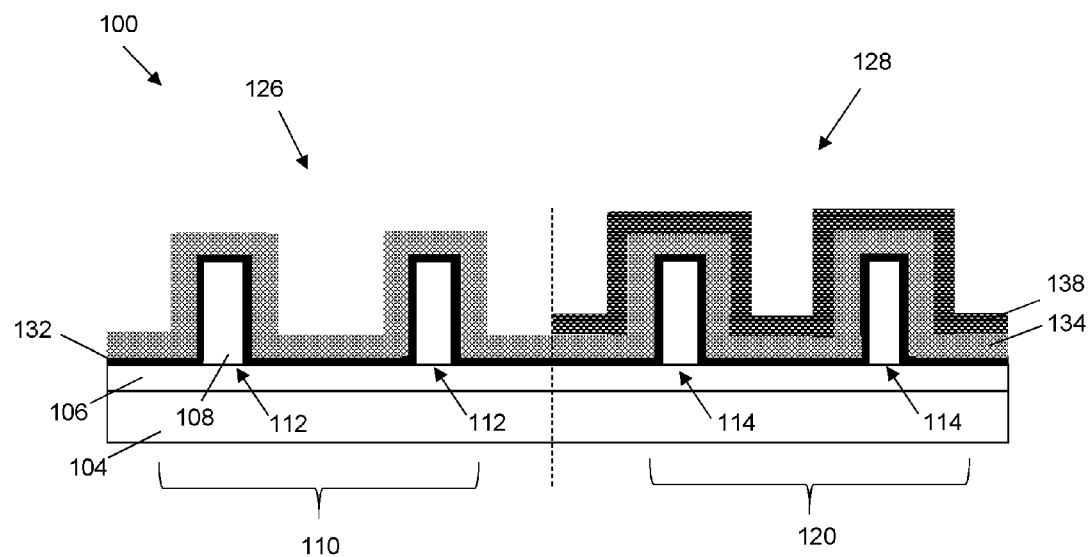
Figure 5:
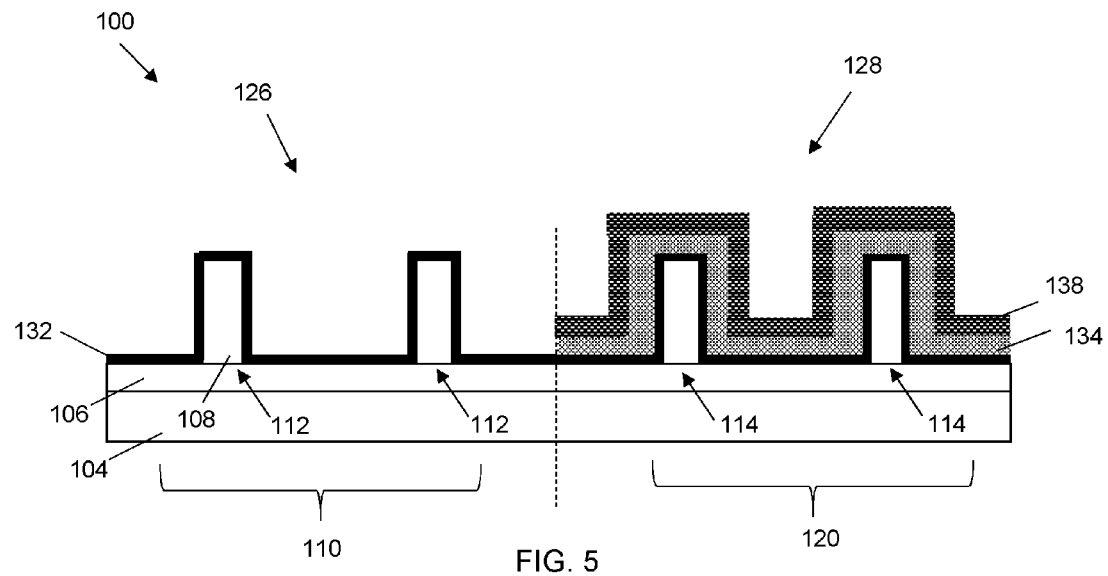

Referring now to FIG. 4, a mask 138, e.g., hardmask, may be formed and patterned to expose NFET region 110. That is, mask 138 may be deposited over FINFET 100 such that it substantially surrounds each fin 112, 114 and patterned such that it exposes NFET region 110 without exposing PFET region 120. Mask 138 may include, for example, a nitride. Exposure of NFET region 110 via mask 138 allows for removal, e.g., wet etching or ashing of work function metal 134 from opening 126 in NFET region 110 as shown in FIG. 5. Work function metal 134 may be removed from over fins 112 in opening 126 such that high-k layer 132 is exposed in opening 126.

Figure 6:
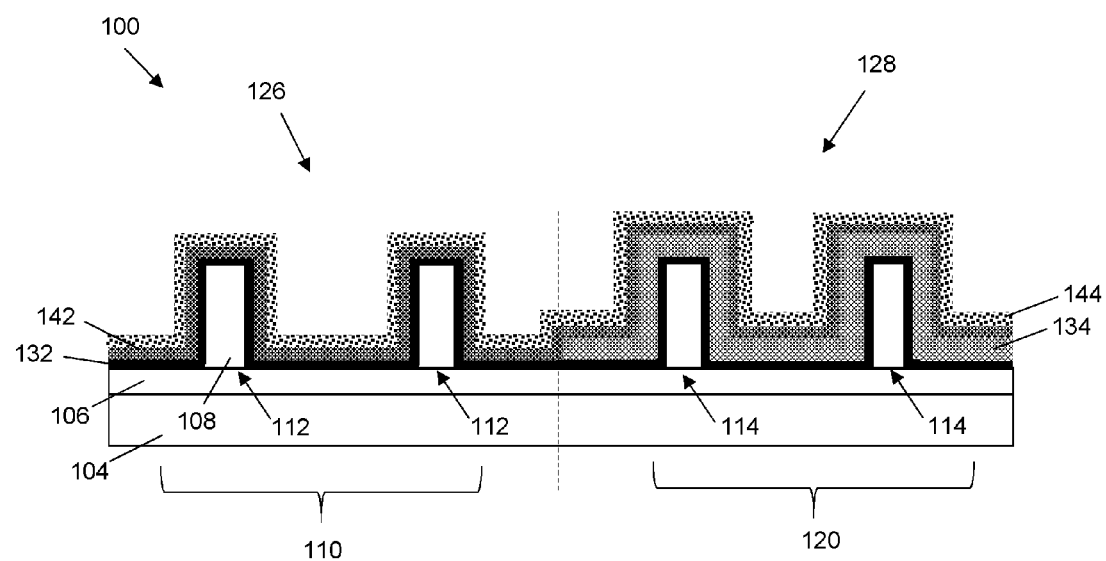

Mask 138 (FIG. 5) may be removed and a barrier layer 142 may be formed within openings 126, 128 as shown in FIG. 6. That is, barrier layer 142 may be formed over high-k layer 132 in opening 126 in NFET region 110 over fins 112 and over work function metal 134 in opening 128 in PFET region 120 over fins 114. Barrier layer 142 may include, for example, titanium nitride (TiN). Barrier layer 142 may have a thickness of approximately 10 Angstroms to approximately 50 Angstroms. More particularly, barrier layer 142 may have thickness of approximately 10 Angstroms. Further, another work function metal 144 may be formed over fins 112, 114 in each opening 126, 128. That is, work function metal 144 may be formed over barrier layer 142 in opening 126 in NFET region 110 over fins 112 and opening 128 in PFET region 120 over fins 114. Work function metal 144 may include a NFET work function metal optimized for NFET performance such as, but not limited to, an aluminum containing metal nitride or carbide, e.g., titanium aluminum carbide (TiAlC). Work function metal 144 may have a thickness of approximately 40 Angstroms to approximately 60 Angstroms although lesser and greater thicknesses can be employed.

Figure 7:
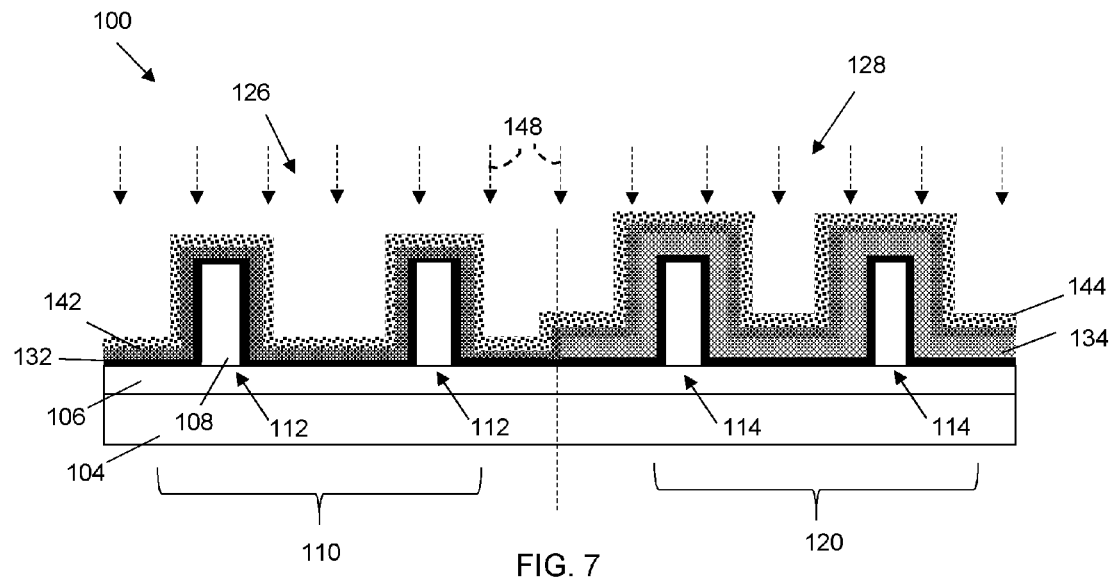
Figure 8:
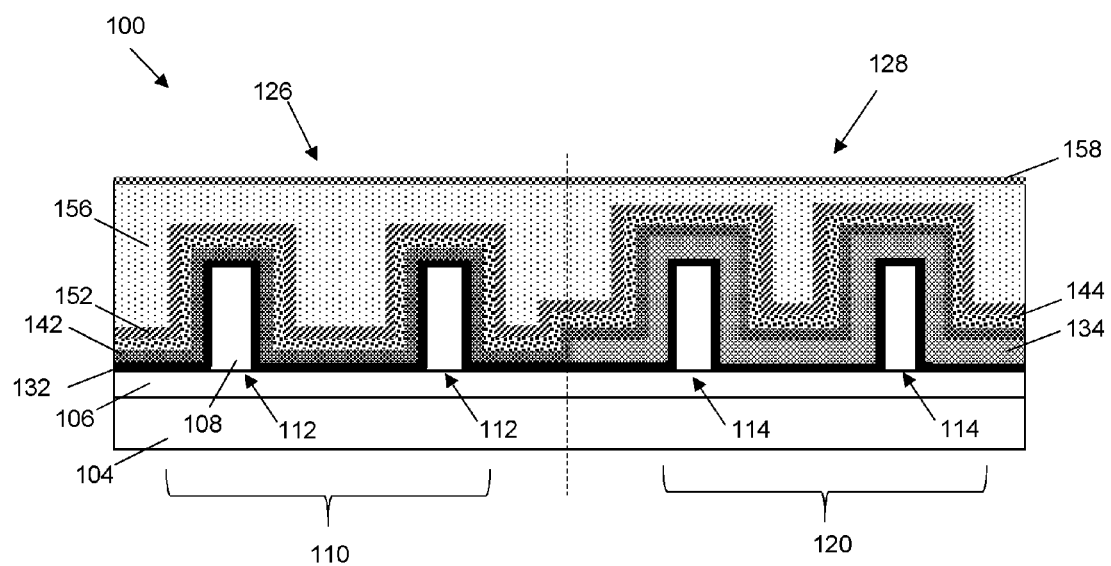

As shown in FIG. 7, work function metal 144 may be implanted with another species 148. Species 148 may include at least one of: nitride (N), carbide (C), and aluminum (Al). After work function metal 144 is implanted, a diffusion barrier metallic layer 152 may be formed over work function metal 144 over fins 112, 114 in each opening 126, 128 as shown in FIG. 8. Diffusion barrier metallic layer 152 may include, but is not limited to, metal nitrides or carbides. Diffusion barrier metallic layer 152 may have a thickness of approximately 35 Angstroms to approximately 60 Angstroms, although lesser and greater thicknesses can be employed. Still referring to FIG. 8, a metal fill 156 may be formed over diffusion barrier metallic layer 152 over fins 112, 114 in each opening 126, 128 such that metal fill 156 substantially fills the remaining portions of openings 126, 128. Metal fill 156 may include but is not limited to tungsten (W).

Still referring to FIG. 8, after metal fill 156 is formed to fill the remaining portions of openings 126, 128, a cap layer 158 may be formed over metal fill 156 and dielectric layer 124 (FIGS. 1-2). Cap layer 158 may include, for example, nitride. The completed FINFET 100 as shown in FIG. 8 includes work function metal 134 in opening 128 and work function metal 144 in both opening 126 and opening 128 over fins 112, 114. In opening 128, work function metal 144 is over work function metal 134. More specifically, opening 126 in NFET region 110 may include high-k layer 132 over fins 112, barrier layer 142 over high-k layer 132, work function metal 144 over barrier layer 142, diffusion barrier metallic layer 152 over work function metal 144, and metal fill 156 over diffusion barrier metallic layer 152. Opening 128 in PFET region 120 may include high-k layer 132 over fins 114, work function metal 134 over high-k layer 132, barrier layer 142 over work function metal 134, work function metal 144 over barrier layer 142, diffusion barrier metallic layer 152 over work function metal 144, and metal fill 156 over diffusion barrier metallic layer 152. Additionally, cap layer 158 may be formed over metal fill 156 in each opening 126, 128.

Further, as described herein, work function metal 134 contains implanted species 138 and work function metal 144 contains implanted species 148. Implanting work function metals 134, 144 with species 138, 148 results in tuning of work function metals 124, 144 to reduce GIDL which increases device performance. This method provides a means to tune the work function of the transistor which the other prior art does not provide.

Figure 9:
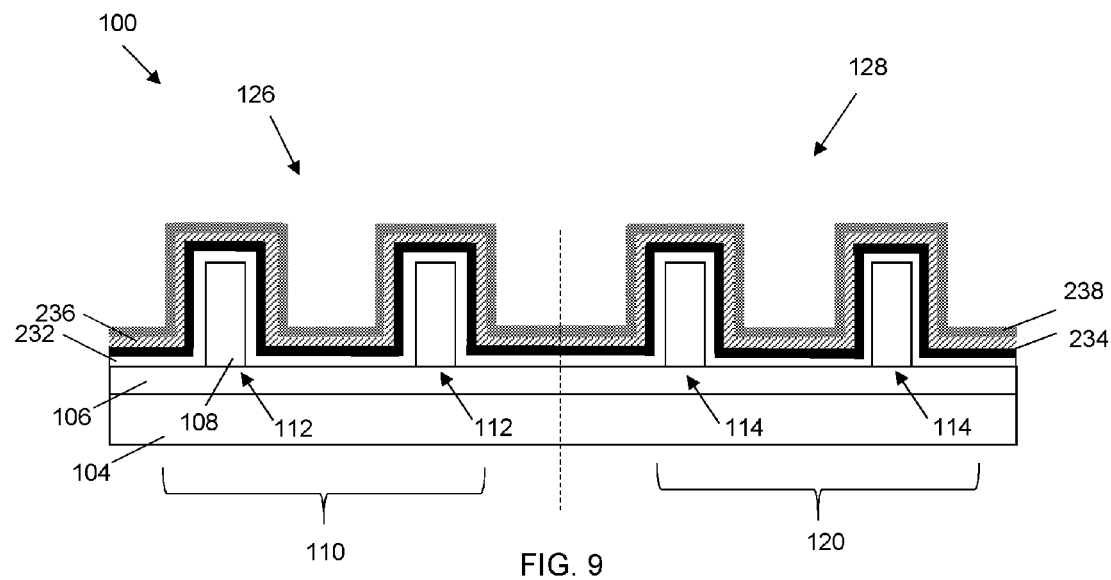
FIGS. 9-15 show cross-sectional views of the integrated circuit structure of FIG. 2 taken along line A-A' undergoing aspects of another method according to embodiments of the disclosure.
Figure 10:
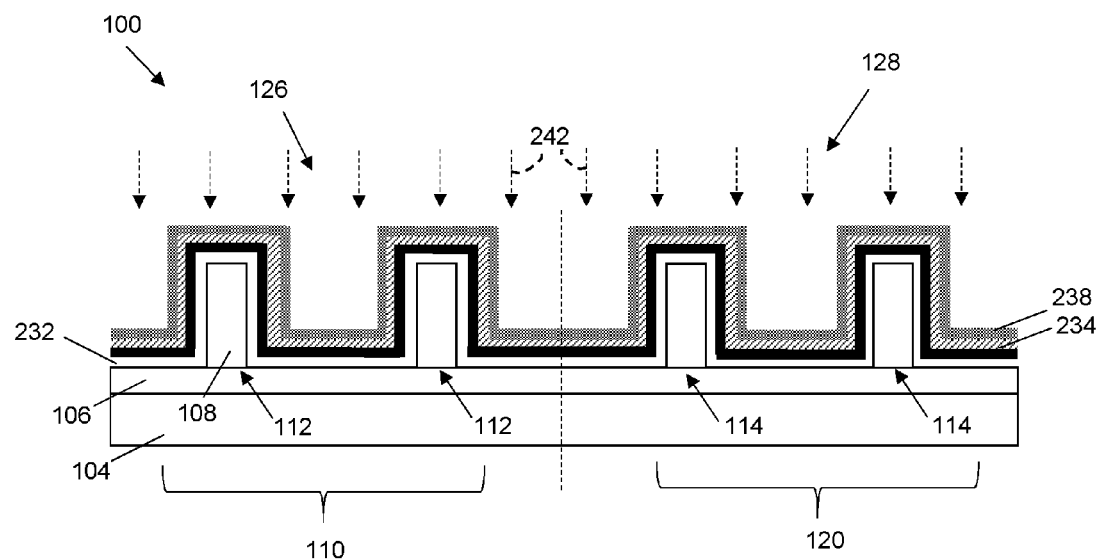

FIGS. 9-15 show cross-sectional views of FINFET 100 along line A-A' of FIG. 2 undergoing aspects of another method as described herein. In this embodiment, an oxide nitridation layer 232 may be formed, e.g., deposited or grown, over each fin 112, 114 as shown in FIG. 9. Oxide nitridation layer 232 may be formed such that is substantially surrounds fins 112, 114 and covers a horizontal field between each fin 112, 114. Oxide nitridation layer 232 may include for example nitridated silicon dioxide ($SiO_2$). Subsequently, a high-k layer 234 may be formed, e.g., deposited or grown over oxide nitridation layer 232 over fins 112, 114. High-k layer 234 may include but is not limited to: hafnium oxide ($HfO_2$) or high dielectric constant (>3.9) materials. High-k layer 234 and oxide nitridation layer 232 may each have a thickness of approximately 10 Angstroms to approximately 20 Angstroms. More particularly, high-k layer 234 and oxide nitridation layer 232 may have thickness of approximately 16 Angstroms. Still referring to FIG. 9, a barrier layer 236 may be formed, e.g., deposited or grown, over high-k layer 234 over fins 112, 114. Barrier layer 236 may have a thickness of approximately 5 Angstroms to approximately 15 Angstroms. More particularly, barrier layer 236 may have thickness of approximately 10 Angstroms. Further, a work function metal 238 may be formed, e.g., deposited or grown, over barrier layer 236 over fins 112, 114 within each opening 126, 128. In this embodiment, work function metal 238 may include a NFET work function metal optimized for NFET performance. Work function metal 238 may be implanted with a species 242, e.g., a dopant, as shown in FIG. 10. Species 242 may include at least one of: nitrogen (N), carbon (C), and aluminum (Al). Work function metal 238 may have a thickness of approximately 45 Angstroms to approximately 60 Angstroms. More particularly, work function metal 238 may have thickness of approximately 50 Angstroms.

Figure 11:
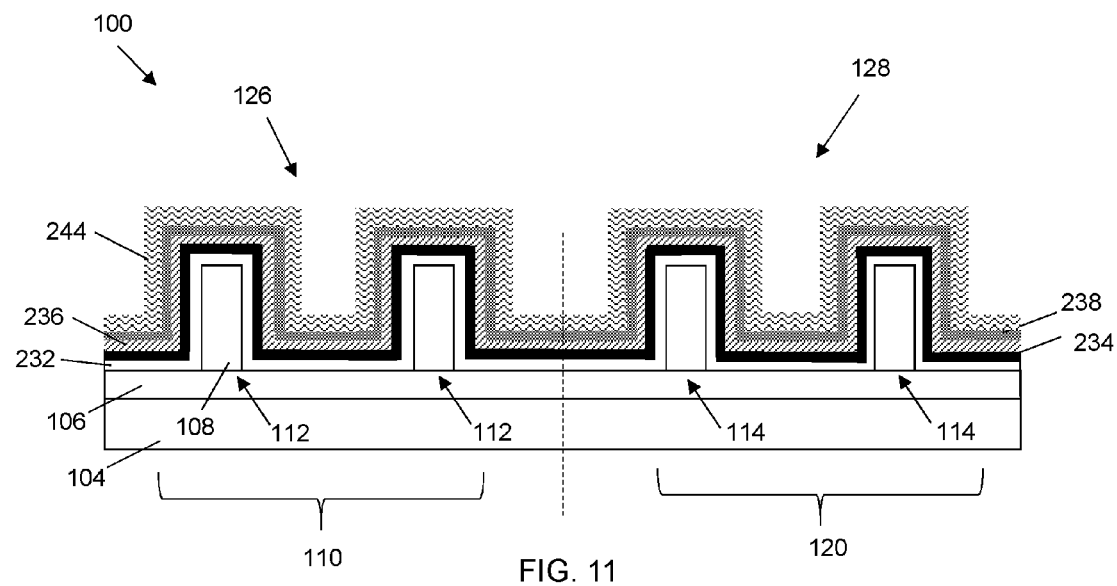
Figure 12:
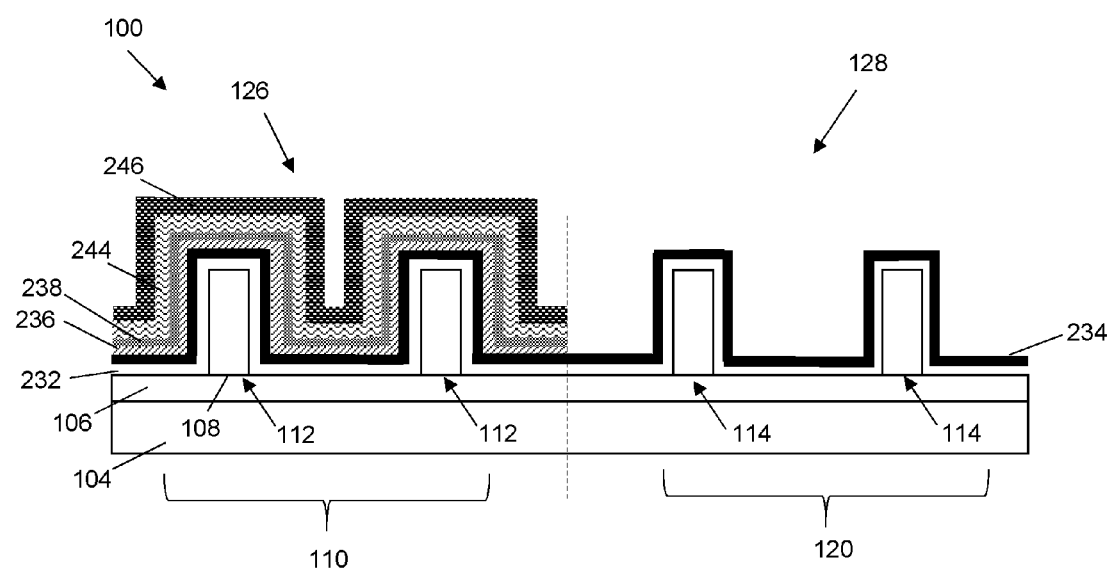

Referring now to FIG. 11, another barrier layer 244 may be formed over work function metal 238 over fins 112, 114 after work function metal 238 has been implanted with species 242 (FIG. 10). Barrier layer 244 may include but is not limited to metal nitrides. Barrier layer 244 may have a thickness of approximately 5 Angstroms to approximately 15 Angstroms. More particularly, barrier layer 244 may have thickness of approximately 10 Angstroms. Further, as shown in FIG. 12, a mask 246, e.g., hardmask, may be formed and patterned to expose PFET region 120. That is, mask 246 may be deposited over FINFET 100 such that it substantially surrounds each fin 112, 114 and patterned such that it exposes PFET region 120 without exposing NFET region 110. Mask 244 may include, for example, a nitride. Exposure of PFET region 120 via mask 244 allows for removal of work function metal 238 and barrier layers 236, 244 from opening 128 in PFET region 120 to expose high-k layer 234 in opening 128 as shown in FIG. 12.

Figure 13:
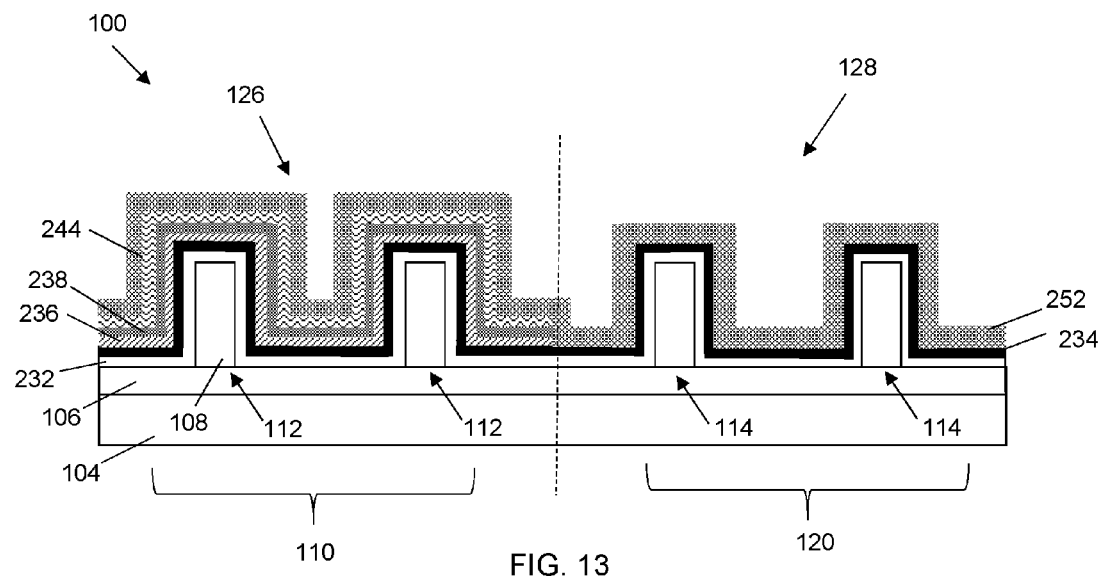
Figure 14:
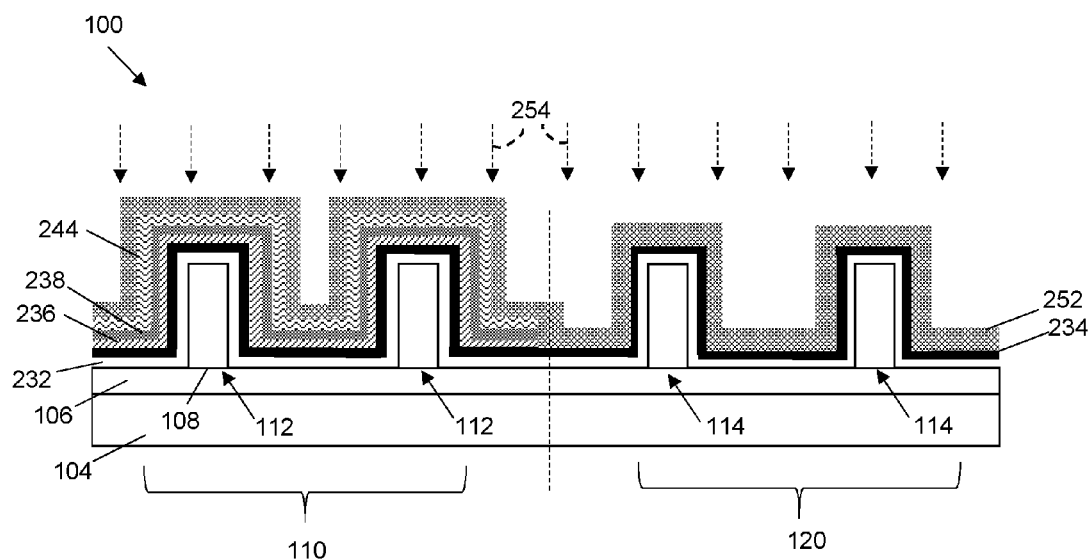
Figure 15:
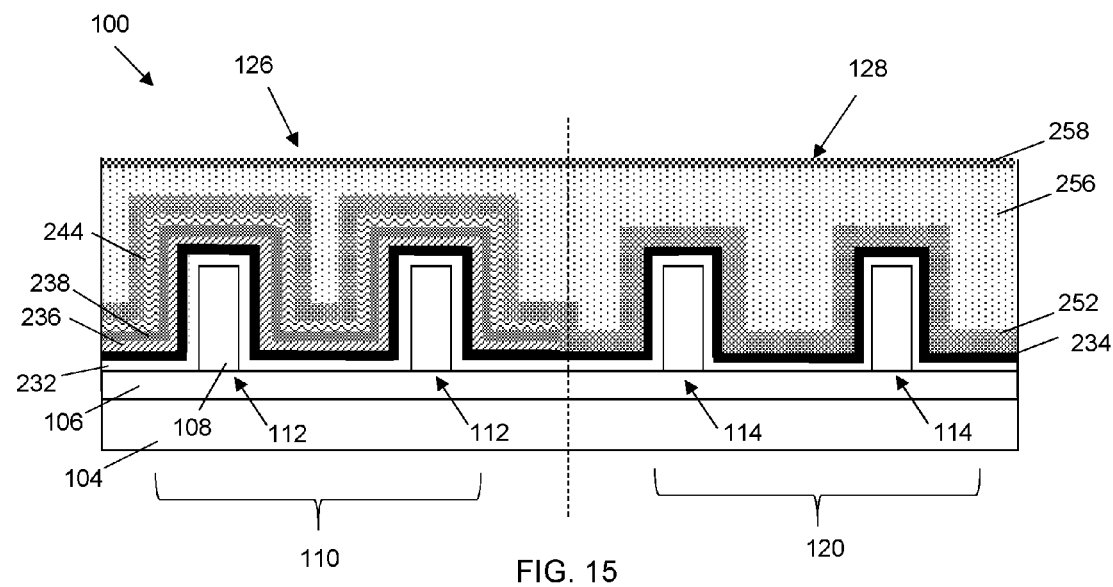

As shown in FIG. 13, another work function metal 252 may be formed in each opening 126, 128 over fins 112, 114. That is, work function metal 252 may be formed over barrier layer 244 in opening 126 in NFET region 110 over fins 112 and over high-k layer 234 in opening 128 in PFET region 120 over fins 114. In this embodiment, work function metal 252 may include a PFET work function metal optimized for PFET performance such as but not limited to a metallic nitride layer, e.g., titanium nitride (TiN) or tantalum nitride (TaN). Work function metal 252 may have a thickness of approximately 15 Angstroms to approximately 50 Angstroms, although lesser and greater thicknesses can be employed As shown in FIG. 14, work function metal 252 may be implanted with species 254, e.g., a dopant. In this embodiment, species 254 may include at least one of fluorine (F) and aluminum (Al). After work function metal 252 is implanted with species 254, a metal fill 256 may be formed over work function metal 252 in each opening 126, 128 over fins 112, 114 such that metal fill 256 substantially fills the remaining portions of openings 126, 128 as shown in FIG. 15. Metal fill 256 may include but is not limited to tungsten (W).

Still referring to FIG. 15, after metal fill 256 is formed to fill the remaining portions of openings 126, 128, a cap layer 258 may be formed over metal fill 256 over fins 112, 114 and dielectric layer 124 (FIGS. 1-2). Cap layer 258 may include, for example, nitride. The completed FINFET 100 as shown in FIG. 15 includes work function metal 244 in opening 126 and work function metal 252 in both opening 126 and opening 128. In opening 126, work function metal 252 is over work function metal 244. More specifically, opening 126 in NFET region 110 may include nitridated oxide layer 232 over fins 112, high-k layer 234 over nitridated oxide layer 232, barrier layer 236 over high-k layer 234, work function metal 238 over barrier layer 236, barrier layer 244 over work function metal 238, work function metal 252 over barrier layer 244, and metal fill 256 over work function metal 252. Opening 128 in PFET region 110 may include nitridated oxide layer 232 over fins 114, high-k layer 234 over nitridated oxide layer 232, work function metal 252 over high-k layer 234, and metal fill 256 over work function metal 252. Additionally, cap layer 258 may be formed over metal fill 256 in each opening 126, 128.

Further, as described herein, work function metal 238 contains implanted species 242 and work function metal 252 contains implanted species 254. Implanting work function metals 238, 252 with species 242, 254 results in tuning of work function metals 238, 252 to reduce GIDL which increases device performance.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming a gate stack for an integrated circuit structure, the method comprising:
    forming an oxide nitridation layer over the set of fins;
    after the forming of the oxide nitridation layer, forming a layer having a high dielectric constant over the set of fins;
    after the forming of the oxide nitridation layer, forming a first work function metal over a set of fins having at least a first fin and a second fin;
    implanting the first work function metal with a first species to tune a work function of the first work function metal;
    removing a portion of the implanted first work function metal from over the first fin such a remaining portion of the implanted first work function metal remains over the second fin;
    forming a second work function metal over the set of fins including over the remaining portion of the implanted first work function metal;
    implanting the second work function metal with a second species to tune a work function of the second work function metal; and
    forming a metal over the implanted second work function metal over the set of fins thereby forming the gate stack.

2. The method of claim 1, wherein the forming the first work function metal includes forming a layer of metal nitride, and
    wherein the implanting the first work function metal with the first species includes implanting the layer of metal nitride with at least one of: fluorine and aluminum.

3. The method of claim 1, further comprising:
    forming a diffusion barrier metallic layer over the second work function metal over the set of fins after the implanting of the second work function metal and prior to the forming of the metal.

4. The method of claim 1, further comprising:
    forming a nitride cap layer over the metal over the set of fins after the forming of the metal.

5. The method of claim 1, further comprising:
    forming a barrier layer over the set of fins after the removing of the implanted first work function metal and prior to the forming of the second work function metal over the set of fins such that the barrier layer substantially separates the first work function metal and the second work function metal over the second fin.

6. The method of claim 1, wherein the forming of the first work function metal includes forming a layer of aluminum containing metal, and
    wherein the implanting the first work function metal with the first species includes implanting the layer of aluminum containing metal with at least one of: carbon, nitrogen, and aluminum.

7. The method of claim 1, further comprising:
    forming a barrier layer over the set of fins prior to the forming of the first work function metal; and
    removing a portion of the barrier layer from over the first fin such that a remaining portion of the barrier layer remains over the second fin prior to the forming of the second work function metal.

8. The method of claim 1, further comprising:
    forming a barrier layer over the set of fins after the implanting of the first work function metal and prior to the removing of the first work function metal; and
    removing a portion of the barrier layer from over the first fin such that a remaining portion of the barrier layer remains on the second fin prior to the forming of the second work function metal.

9. The method of claim 1, wherein the implanting of the first work function metal and the implanting of the second work function metal reduce a gate-induced drain leakage of the integrated circuit structure.

10. The method of claim 2, wherein the forming the second work function metal includes forming a layer of aluminum containing metal, and wherein the implanting the second work function metal with the second species includes implanting the layer of aluminum containing metal with at least one of: carbon, nitrogen, and aluminum.

11. The method of claim 6, wherein the forming the second work function metal includes forming a layer of metal nitride, and
wherein the implanting the second work function metal with the second species includes implanting the layer of metal nitride with at least one of: fluorine or aluminum.

12. A gate stack for an integrated circuit structure, the integrated circuit structure having a set of fins including a first fin and a second fin, the gate stack comprising:
a first work function metal over the first fin, the first work function metal including a first implanted species for tuning a work function of the first work function metal;
a second work function metal over the first fin and second fin, the second work function metal being over the first work function metal over the first fin and including a second implanted species for tuning a work function of the second work function metal;
a metal over the second work function metal; and
a diffusion barrier metallic layer substantially separating the second work function metal and the metal over the set of fins.

13. The gate stack of claim 12, wherein the first work function metal includes a metal nitride and the first implanted species includes at least one of: fluorine and aluminum, and
wherein the second work function metal includes aluminum containing metal and the second implanted species includes at least one of: carbon, nitrogen, and aluminum.

14. The gate stack of claim 12, wherein the first work function metal includes aluminum containing metal and the first implanted species includes at least one of: carbon, nitrogen, and aluminum, and
wherein the second work function metal includes a metal nitride and the second implanted species includes at least one of: fluorine and aluminum.

15. The gate stack of claim 12, further comprising:
a layer having a high dielectric constant over the set of fins and beneath the first work function metal over the first fin and beneath the second work function metal over the second fin.

16. The gate stack of claim 12, further comprising:
a barrier layer over the set of fins,
wherein the barrier layer substantially separates the second work function metal from the second fin, and
wherein the barrier layer substantially separates the first work function metal and the second work function metal over the first fin.

17. The gate stack of claim 12, further comprising:
a barrier layer substantially separating the first work function metal and the second work function metal over the second fin.

18. The gate stack of claim 15, further comprising:
an oxide nitridation layer over the set of fins and beneath the layer having a high dielectric constant.

19. A method of forming a gate stack for an integrated circuit structure, the method comprising:
forming a first work function metal over a set of fins having at least a first fin and a second fin;
implanting the first work function metal with a first species to tune a work function of the first work function metal;
removing a portion of the implanted first work function metal from over the first fin such a remaining portion of the implanted first work function metal remains over the second fin;
forming a second work function metal over the set of fins including over the remaining portion of the implanted first work function metal;
implanting the second work function metal with a second species to tune a work function of the second work function metal;
forming a diffusion barrier metallic layer over the second work function metal over the set of fins; and
forming a metal over the diffusion barrier metallic layer over the set of fins thereby forming the gate stack.

20. The method of claim 19, wherein the implanting of the first work function metal and the implanting of the second work function metal reduce a gate-induced drain leakage of the integrated circuit structure.

* * * * *